US008564362B2

(12) United States Patent
Tokumaru et al.

(10) Patent No.: US 8,564,362 B2
(45) Date of Patent: *Oct. 22, 2013

(54) FILTER CIRCUIT, SEMICONDUCTOR INTEGRATED CIRCUIT, COMMUNICATION APPARATUS, SEMICONDUCTOR DEVICE, AND SYSTEM

(71) Applicant: Panasonic Corporation, Osaka (JP)

(72) Inventors: Michiko Tokumaru, Osaka (JP); Heiji Ikoma, Nara (JP); Kouji Okamoto, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/759,740

(22) Filed: Feb. 5, 2013

(65) Prior Publication Data
US 2013/0148758 A1 Jun. 13, 2013

Related U.S. Application Data

(63) Continuation of application No. 13/240,179, filed on Sep. 22, 2011, now Pat. No. 8,395,442, which is a continuation of application No. PCT/JP2009/003949, filed on Aug. 19, 2009.

(30) Foreign Application Priority Data

Mar. 27, 2009 (JP) ................................ 2009-079654

(51) Int. Cl.
H03K 5/00 (2006.01)
(52) U.S. Cl.
USPC .......................................... 327/551; 327/552

(58) Field of Classification Search
USPC .................................................. 327/551–559
See application file for complete search history.

(56) References Cited

U.S. PATENT DOCUMENTS 3,875,555 A * 4/1975 Potter ........................... 340/939
4,965,536 A 10/1990 Yoshida
(Continued)

FOREIGN PATENT DOCUMENTS

JP 01-060106 A 3/1989
JP 02-062124 A 3/1990
(Continued)

OTHER PUBLICATIONS

Jafar Savoj et al. "A 12-GS/s Phase-Calibrated CMOS Digital-to-Analog Converter", 2007 Symposium on VLSI Circuits Digest of Technical Papers, Jun. 14-16, 2007, pp. 68-69.

(Continued)

Primary Examiner — Dinh T. Le
(74) Attorney, Agent, or Firm — McDermott Will & Emery LLP

(57) ABSTRACT

A filter circuit includes two parallel digital filters, a DAC, and an LPF. The DAC includes two parallel decoders, a parallel-to-serial converter, a switch driver, and a switch. A PLL circuit supplies a reference clock to the DAC. A frequency divider provided in the DAC divides the frequency of the reference clock by two, and supplies the half frequency clock to a parallel processing section (the two decoders and the parallel-to-serial converter) of the DAC and the two digital filters. This makes it easy to secure a timing margin, permitting use in high-speed communication on the order of several GHz.

18 Claims, 6 Drawing Sheets

(56) References Cited

U.S. PATENT DOCUMENTS

| | | |
|---|---|---|
| 6,486,926 B1 | 11/2002 | Heizmann et al. |
| 6,650,258 B1 * | 11/2003 | Kelly et al. ............... 341/61 |
| 7,003,049 B2 | 2/2006 | Hietala |
| 7,403,580 B2 | 7/2008 | Ishii et al. |
| 2007/0018876 A1 | 1/2007 | Jiang et al. |
| 2007/0160164 A1 | 7/2007 | Sahota |
| 2008/0192875 A1 | 8/2008 | Saito et al. |

FOREIGN PATENT DOCUMENTS

| | | |
|---|---|---|
| JP | 02-063208 A | 3/1990 |
| JP | 03-236619 A | 10/1991 |
| JP | 2008-527935 A | 7/2008 |

OTHER PUBLICATIONS

Jafar Savoj et al. "A 12-GS/s Phase-Calibrated CMOS Digital-to-Analog Converter for Backplane Communications", IEEE Journal of Solid-State Circuits, vol. 43, No. 5, May 2008, pp. 1207-1216.

Notice of Allowance mailed Nov. 5, 2012 issued by the U.S. Patent Office in U.S. Appl. No. 13/240,179.

"Synchronizing Multiple High-Speed Multiplexed DACs for Transmit Applications" Application Note 3901, 4 pages, Sep. 21, 2006.

* cited by examiner

US 8,564,362 B2

FILTER CIRCUIT, SEMICONDUCTOR INTEGRATED CIRCUIT, COMMUNICATION APPARATUS, SEMICONDUCTOR DEVICE, AND SYSTEM

CROSS-REFERENCE TO RELATED APPLICATION

This is a Continuation of U.S. application Ser. No. 13/240,179, filed on Sep. 22, 2011, now U.S. Pat. No. 8,395,442, which is a continuation of PCT International Application PCT/JP2009/003949 filed on Aug. 19, 2009, which claims priority to Japanese Patent Application No. 2009-079654 filed on Mar. 27, 2009. The disclosures of these applications including the specifications, the drawings, and the claims are hereby incorporated by reference in their entirety.

BACKGROUND

The present disclosure relates to a transmission filter capable of high-speed processing for achievement of high-speed communication. Conventionally, in a communication system that transmits a signal from an antenna, a signal with a frequency band necessary for a transmission signal is extracted by a transmission filter, the signal is modulated by mixing with a carrier in a radio frequency (RF) section, and then the resultant signal is transmitted from the antenna as the transmission signal. IEEE 802.15.3c defines a root raised cosine (RRC) filter of a (roll-off factor)=0.25 as a transmission filter for milliwave communication systems. To implement such an RRC filter of α=0.25 in analog form, a 14th or higher order filter is necessary, and one-chip implementation of such a filter is not practical. Thus, implementation of a transmission filter poses a large problem.

To solve the above problem, Japanese Translation of PCT International Application No. 2008-527935 (FIG. 1), for example, proposes a transmission filter implemented using a digital filter and a DAC. The configuration of this transmission filter is shown in FIG. 9.

In FIG. 9, a transmission filter 1 includes a digital filter 2, a digital-to-analog converter (DAC) 3, a PLL circuit 4, and a low pass filter (LPF) 5. In the transmission filter 1, the output of the digital filter 2 is converted to an analog value by the DAC 3, and then a high-frequency component of the analog value is rejected by the LPF 5 connected downstream of the DAC 3. Both the digital filter 2 and the DAC 3 operate with a clock supplied from the PLL circuit 4 via a clock line 6. The transmission filter 1 is used for communication at a speed on the order of several MHz.

SUMMARY

In recent years, milliwave wireless communication systems using a 30 to 300 GHz band, which are positioned in a wireless personal area network (PAN), have been increasingly receiving attention. This is mainly because of the two reasons: one is that a 60 GHz band is a license-free band, and the other is that, with the miniaturization of CMOS devices, one-chip implementation of a 60 GHz RF section is gradually becoming possible.

In relation to the above, if the above conventional transmission filter being used for communication at a speed on the order of several MHz is considered to be used for a communication system of several GHz, the following problem will arise.

That is, in the conventional transmission filter, for proper reception of data values by the digital filter 2 and the DAC 3, an appropriate timing relationship is necessary between the supplied clock and the input data. When the clock is supplied to the digital filter 2 and the DAC 3 individually from the PLL circuit 4, there will occur a delay due to a resistance component, a parasitic capacitance component, etc. and a delay due to a buffer (not shown in FIG. 9) inserted in the clock line 6. Therefore, timing design must be performed considering these delays, variations in these delays, etc. In the case of managing a high-speed signal of several GHz, however, as the timing restriction between the supplied clock and the input data will be further strict, it is extremely difficult to secure a margin.

Thus, it is extremely difficult to secure a timing margin using the conventional transmission filter for communication at a speed about several MHz, for a communication system of several GHz.

It is an objective of the present disclosure to provide a transmission filter capable of securing a timing margin comparatively easily even when used for a high-speed communication system of several GHz, for example.

To attain the above objective, according to the present disclosure, a filter circuit is configured to reduce a delay due to a resistance component, a parasitic capacitance component, etc. in a clock line, which may affect the timing design. Also, a transmission filter for transmitting a signal having a plurality of channels is configured to share a clock between the channels.

More specifically, the filter circuit of the present disclosure is a filter circuit including a plurality of digital filters and a digital-to-analog converter (DAC) having a plurality of decoders, the plurality of digital filters and the plurality of decoders of the DAC performing parallel processing, wherein the filter circuit of the present disclosure further includes: a PLL circuit configured to supply a reference clock to the DAC; and a frequency divider placed in the DAC, configured to divide the frequency of the supplied reference clock, and a frequency-divided clock generated by the frequency divider is supplied to a parallel processing section including the plurality of decoders in the DAC and the plurality of digital filters.

Alternatively, the filter circuit of the present disclosure is a filter circuit receiving a signal having a plurality of channels, including digital filters and DACs equal in number to the plurality of channels, wherein the plurality of DACs share a clock buffer inserted in a reference clock line from a PLL circuit.

In the filter circuit described above, the signal having the plurality of channels may be an orthogonal signal including an I signal and a Q signal.

Alternatively, the filter circuit of the present disclosure is a filter circuit including a digital filter and a DAC configured to convert a digital output of the digital filter to an analog value, wherein the filter circuit further includes a comparator configured to compare an output signal of the DAC with an expected value, and a delay of a clock signal supplied to the DAC or a delay of data in the DAC is adjusted according to a comparison result of the comparator.

According to another aspect of the present disclosure, a timing adjustment method for the filter circuit described above is provided, wherein, during a predetermined timing test time, a test signal is input into the DAC from the digital filter, a timing test is performed by the comparator where an output signal of the DAC having received the test signal is compared with an expected value for the test signal, and the filter circuit proceeds to a normal operation mode if the output signal of the DAC matches with the expected value, or adjusts a delay of a clock signal supplied to the DAC or a delay of data in the DAC if the output signal of the DAC does not match with the expected value.

In the timing adjustment method for the filter circuit described above, after the adjustment of a delay of the clock signal supplied to the DAC or a delay of data in the DAC, the timing test may be repeated until the output signal of the DAC matches with the expected value.

In the timing adjustment method for the filter circuit described above, the timing test time may be a power-up time.

In the timing adjustment method for the filter circuit described above, the test signal may be a signal having a pattern with which the expected value takes the same value continuously by a predetermined number of times and changing the cycle of taking the same value, and the comparator may operate at a frequency lower than a sampling frequency of the DAC.

In the timing adjustment method for the filter circuit described above, the test signal may have a pattern of changing all of a plurality of switches for data change placed in the DAC.

In the filter circuit described above, the clock signal supplied to the DAC may be delayed by changing a current ability of a buffer placed in a clock line for supply of the clock signal.

The filter circuit described above may be a transmission filter placed upstream of a radio frequency (RF) section that outputs a signal from an antenna.

The semiconductor integrated circuit of the present disclosure includes the filter circuit described above.

The communication apparatus of the present disclosure includes the filter circuit described above.

As described above, according to the present disclosure, when a plurality of digital filters are placed, and also a parallel processing section having a plurality of decoders is placed in a DAC, for implementation of a filter circuit operating at high speed, a frequency divider that generates a frequency-divided clock to be supplied to the digital filters and the parallel processing section of the DAC is placed in the DAC. Therefore, no consideration is necessary for the timing between a PLL circuit that generates a reference clock and the DAC, and this makes it easy to secure a timing margin in the filter circuit operating at a high speed of several GHz.

Also, according to the present disclosure, in a filter circuit receiving a signal having a plurality of channels, a plurality of DACs share a clock buffer inserted in a reference clock line from a PLL circuit. Thus, the linearity of the signal having the plurality of channels can be secured nicely.

Moreover, according to the present disclosure, a comparator is provided, to permit correction of the timing relationship between the data and the clock in the filter circuit according to the comparison result of the comparator. Thus, variations in a semiconductor fabrication process and a timing error caused by deterioration with time can be effectively prevented.

As described above, according to the filter circuit of the present disclosure, a timing margin between data and a clock can be easily secured. Thus, a filter circuit operating at a high speed of several GHz can be implemented.

DETAILED DESCRIPTION

Embodiments of the present disclosure will be described hereinafter with reference to the accompanying drawings.

(First Embodiment)

Figure 1:
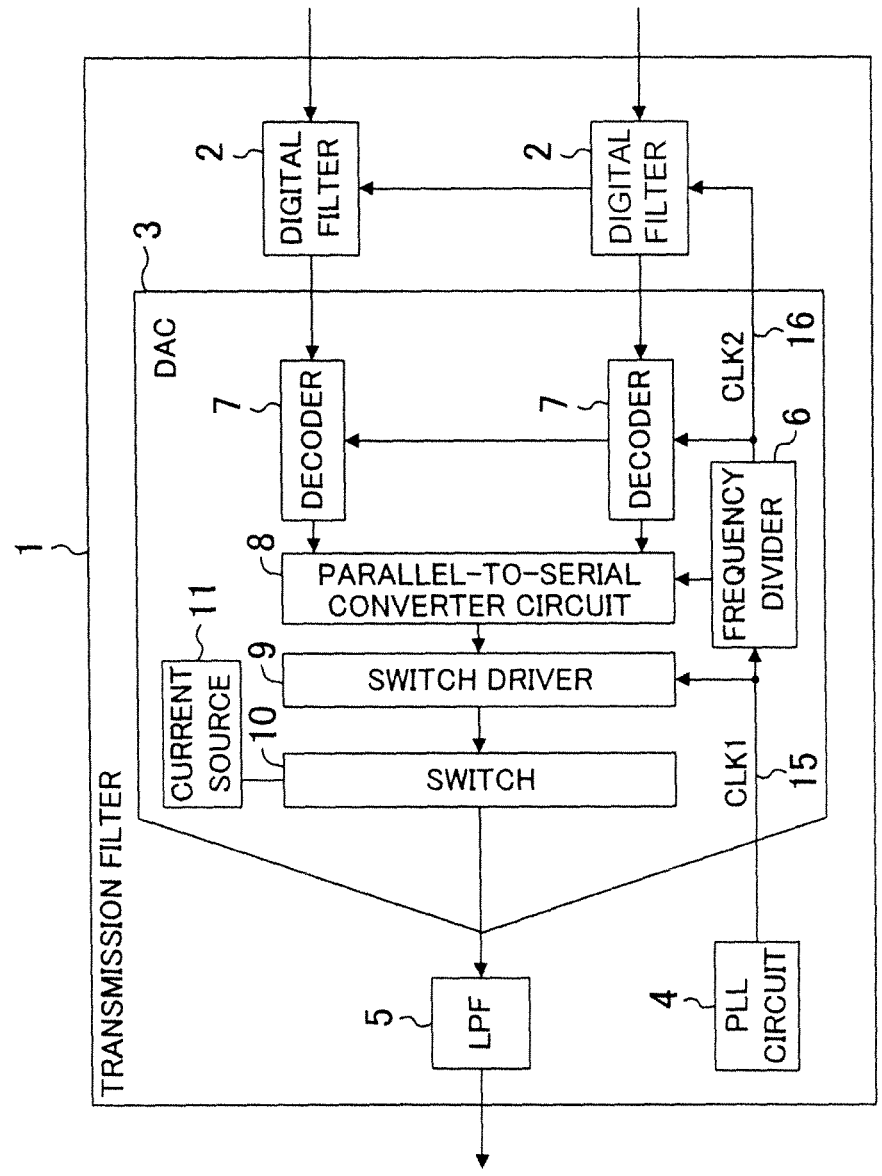
FIG. 1 is a view showing a configuration of a transmission filter circuit of the first embodiment of the present disclosure.

FIG. 1 shows a configuration of a transmission filter circuit of the first embodiment of the present disclosure.

In FIG. 1, a transmission filter 1 includes two parallel digital filters 2, one DAC 3, a PLL circuit 4, and an LPF 5.

The DAC 3 includes two parallel decoders 7, a parallel-to-serial converter circuit 8, a switch driver 9, a switch 10, and a current source 11. The DAC 3 is of a current summing type, in which the two decoders 7 respectively decode binary data received from the two digital filters 2 into hexadecimal data, etc., the parallel-to-serial converter circuit 8 then converts the decoded data to one unit of serial data, and the switch driver 9, receiving the serial data, drives the switch 10. In this way, the output and inverted output of a current supplied from the current source 11 are controlled according to the digital data from the two parallel digital filters 2, thereby to obtain a desired analog value.

In this embodiment, the transmission filter 1 is operated at a high speed of several GHz. To implement this high-speed transmission filter comparatively easily, plural (n) digital filters 2 are arranged to operate in parallel. Since the operating frequency of each of n digital filters 2 can be 1/n of the operating frequency of the transmission filter 1, each digital filter 2 can be easily configured. For example, when 3.456 GHz high-speed operation of the transmission filter 1 is intended, it is only necessary to allow the digital filters 2 in this embodiment, which are in two-parallel configuration, to perform parallel operation at 1.728 GHz.

Since input data is processed in parallel by the two digital filters 2, the DAC 3 is provided with the two decoders 7, equal in number to the digital filters 2. The two decoders 7 decode the outputs of the two digital filters 2 in parallel, and the parallel-to-serial converter circuit 8 at the following stage converts the decoded parallel data to one serial data. Thus, the operating frequency of the decoders 7 can also be 1/n of the operating frequency of the transmission filter 1.

The PLL circuit 4 generates a reference clock CLK1, which is supplied to the switch driver 9 of the DAC 3 via a reference clock line 15.

The DAC 3 also includes a frequency divider 6, which receives the reference clock CLK1 via the reference clock line 15 and divides the frequency of the reference clock CLK1 by two. The resultant half-frequency clock CLK2 is supplied to the two digital filters 2 operating in parallel and the parallel processing section (i.e., the two decoders 7 and the parallel-to-serial converter circuit 8) of the DAC 3 via a half-frequency clock line 16.

The output data of the DAC 3 operating at high speed and the reference clock CLK1 supplied from the PLL circuit 4 to the DAC 3 are transmitted as differential data.

Next, the operation of the first embodiment will be described. First, consider the timing in the DAC 3. The switch driver 9 receives the reference clock CLK1 while the two decoders 7 receive the half-frequency clock CLK2. In this situation, delay factors between the data input into the switch driver 9 and the reference clock CLK1 include a delay of the frequency divider 6, a delay of the half-frequency clock line 16 (also a delay of a buffer if such a buffer is placed in the half-frequency clock line 16), a delay of the parallel-to-serial converter circuit 8, and a delay of data lines.

If the half-frequency clock CLK2 is generated in the PLL circuit 4 and supplied to the parallel processing section of the DAC 3, the half-frequency clock line 16 will become long, and thus a larger delay must be considered. Moreover, since the frequency is different between the reference clock CLK1 and the half-frequency clock CLK2, it will also be necessary to consider a delay caused by a parasitic capacitance, etc. in the reference clock line 15 from the PLL circuit 4 to the DAC 3 and a delay caused by a parasitic capacitance, etc. in the half-frequency clock line from the PLL circuit 4 to the DAC 3. In this case, therefore, timing verification at a higher level with the PLL circuit 4 as the starting point will be necessary. In this embodiment, since the frequency divider 6 is placed in the DAC 3, timing verification can be performed with the input point of the frequency divider 6 receiving the reference clock CLK1 as the starting point. Therefore, no consideration is necessary for the timing between the PLL circuit 4 and the DAC 3, and also the half-frequency clock line 16 can be shortened. This makes it easy to secure a timing margin.

As for the digital filters 2, since the half-frequency clock CLK2 from the frequency divider 6 in the DAC 3 is used as the clock for the digital filters 2, no consideration is necessary for the timing between the PLL circuit 4 and the DAC 3, as in the case described above.

Note that, although the digital filters 2 and the decoders 7 in the DAC 3 are in a two-parallel configuration in the above description, it is naturally acceptable to have an increased number of elements in parallel arrangement, such as an eight-parallel configuration, for example.

As described above, the half-frequency clock CLK2 generated in the DAC 3 is used for data parallel processing in the parallel processing section of the DAC 3 and the two parallel digital filters 2. Thus, delay factors at the timing design can be reduced, and this permits high-speed operation.

(Second Embodiment)

Figure 2:
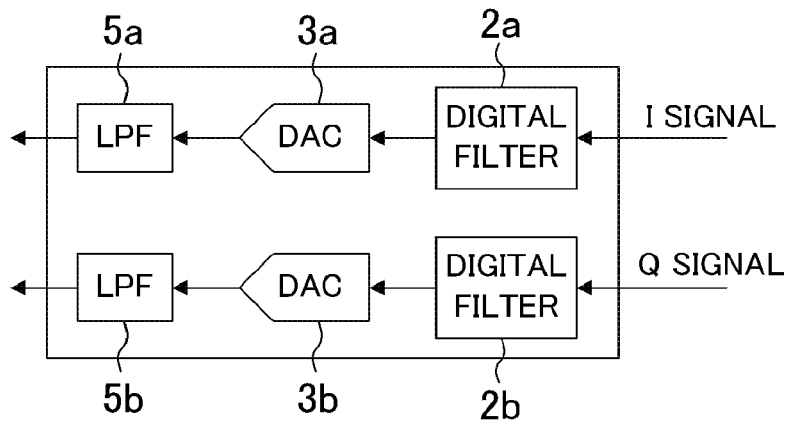
FIG. 2 is a view showing a configuration of a transmission filter circuit of the second embodiment of the present disclosure.
Figure 3:
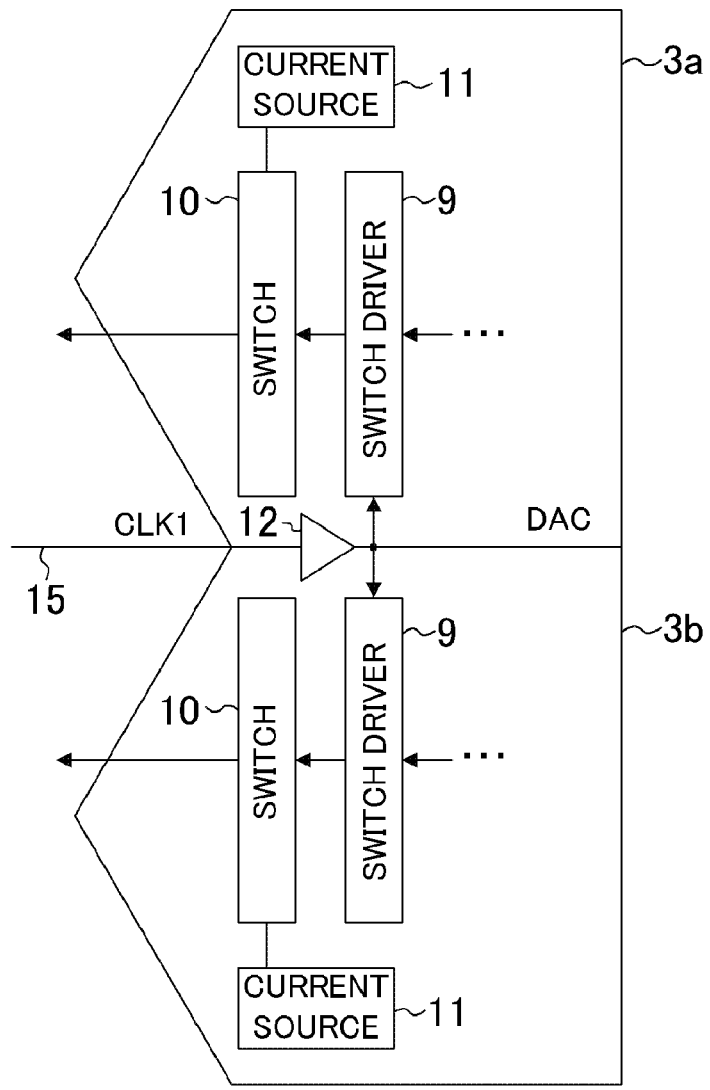
FIG. 3 is a view showing an internal configuration of a DAC provided in the transmission filter circuit of the second embodiment.

FIGS. 2 and 3 show a configuration of a transmission filter circuit of the second embodiment of the present disclosure.

FIG. 2 shows the transmission filter circuit for transmission of a signal having a plurality of channels such as a set of I/Q signals. The transmission filter circuit of FIG. 2 includes a digital filter 2a, a DAC 3a, and an LPF 5a for I signal and a digital filter 2b, a DAC 3b, and an LPF 5b for Q signal.

In the transmission filter circuit for a set of I/Q signals, as shown in FIG. 3, a buffer 12 is inserted in a reference clock line 15 for supplying a reference clock CLK1 to switch drivers 9 in the DACs 3a and 3b, and is shared by the DACs 3a and 3b.

The operation of the second embodiment will be described. In transmission of a set of I/Q signals, if the output timing is different between two signals from the DACs 3a and 3b, the linearity of the transmission signals will deteriorate.

In this embodiment, since the DACs 3a and 3b share the buffer 12 in the reference clock line 15, switches 10 in the DACs 3a and 3b are driven at approximately the same timing. Thus, the two signals from the DACs 3a and 3b are output at approximately the same time.

As described above, in this embodiment, where the buffer 12 in the reference clock line 15 is shared by the DACs 3a and 3b, deterioration in the linearity of the transmission signals can be prevented effectively.

Note that, although one set of I/Q signals are used as the transmission signals in this embodiment, other signals may be used. Also, this embodiment is applicable to three or more transmission signals.

(Third Embodiment)

Figure 4:
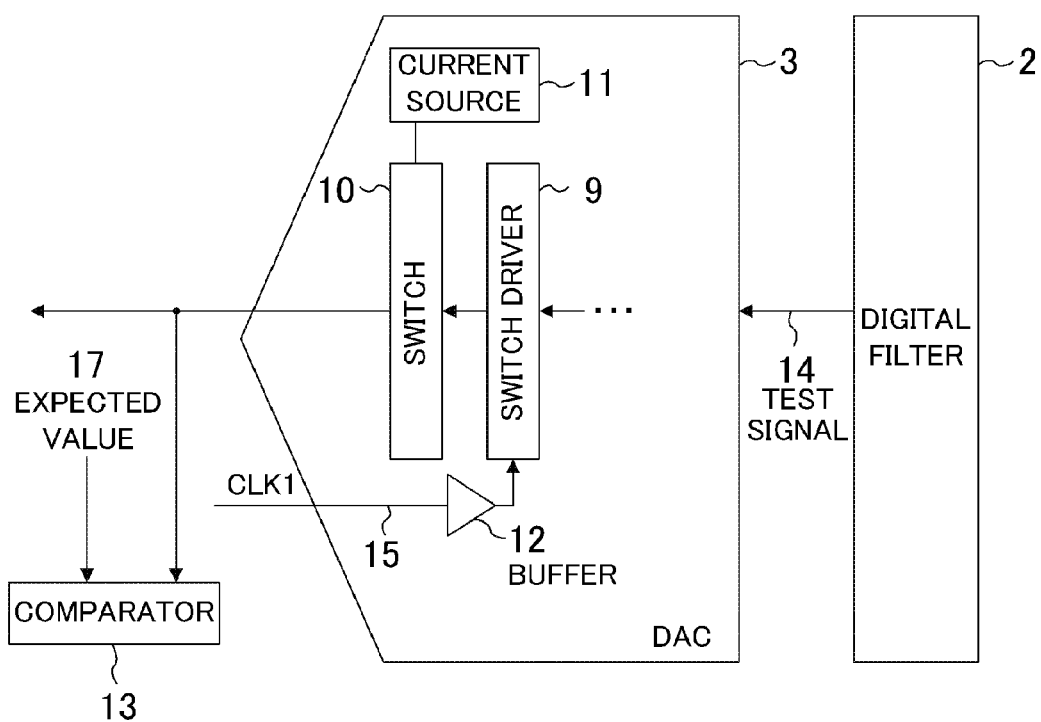
FIG. 4 is a view showing a configuration of a transmission filter circuit of the third embodiment of the present disclosure.

FIG. 4 shows a configuration of a transmission filter circuit of the third embodiment of the present disclosure.

In FIG. 4, a comparator 13 is provided for comparing the output signal of a DAC 3 with an expected value 17. The other configuration is similar to that in FIG. 1. Therefore, the same components as those in FIG. 1 are denoted by the same reference characters, and description of such components is omitted here.

In this embodiment, a test signal 14 is input into the DAC 3 from a digital filter 2 during a timing test time such as a power-up time. The output of the DAC 3 at this time is compared with the expected value 17. If the output result of the DAC 3 does not match with the expected value 17, the current adjustment ability of a buffer 12 placed in a reference clock line 15 in the DAC 3 is adjusted to adjust a delay of the clock, or input timing (delay) of data into a switch driver 9 in the DAC 3 is changed. This operation is performed until the output of the DAC 3 becomes equal to the expected value 17. At timing at which the expected value 17 is obtained, communication in normal operation is started.

The timing design is difficult when the transmission filter circuit operates at high speed, as described above. Therefore, in this embodiment, timing verification and correction is performed during power-up. The test signal 14 and the corresponding expected value 17 are prepared in advance, and whether the expected value 17 is being obtained is determined by the comparator 13. If the determination is affirmative, the test operation shifts to the normal operation mode without any change. If the determination is negative, the buffer 12 or data delay is changed. The test signal 14 is then input again, and the output signal is compared with the expected value 17 by the comparator 13. This series of operation is repeated until the determination becomes affirmative.

When the transmission filter operates at high speed, the output signal of the DAC 3 is also at high speed. In view of this, by setting the test signal 14 so that the corresponding expected value 17 takes the same value continuously by a predetermined number of times, the comparator 13 does not have to operate at high speed, but can operate at low frequency. In the test signal 14, also, the number of cycles of taking the same value continuously by a predetermined number of times is changed.

In the DAC 3 of a current summing type, actually, a plurality of sets of current sources 11 and switches 10 are connected in parallel. Therefore, correction that is more correct can be performed by providing a test signal pattern with which all of the switches 10 of the sets are operated.

With the above configuration, timing errors caused by process variations and deterioration of elements can be prevented effectively.

Note that, while the present disclosure is applied to the transmission filter circuits in the first to third embodiments, it goes without mentioning that the present disclosure is also applicable to filter circuits other than the transmission filters.

(Specific Example of Digital Filter)

An internal configuration of the digital filter 2 will be described with reference to FIG. 5.

Figure 8:
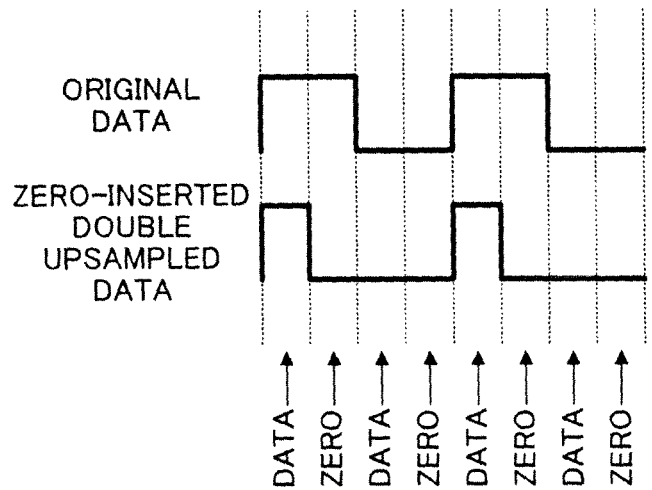
FIG. 8 is a view showing an example of zero-inserted double upsampled data input into a digital filter used in the milliwave communication system of the fourth embodiment.
Figure 9:
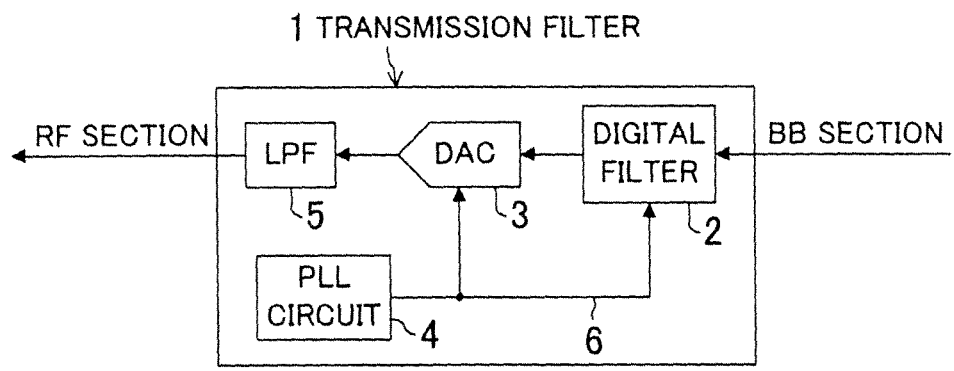
FIG. 9 is a view showing a configuration of a conventional transmission filter circuit.

To obtain sufficient properties as the transmission filter circuit 1, the digital RRC filter 2 is operated at a frequency twice as high as the transfer rate. For example, when the transfer rate is 1.728 Gbps, the operating frequency of the digital filter 2 is 3.456 GHz. The input signal of the digital filter 2 is a signal obtained by subjecting 1.728 Gbps binary data to zero-inserted double upsampling. The zero-inserted double upsampling refers to the operation of sampling original data at double speed while inserting zero values between the data units sampled, as shown in FIG. 8.

To implement the digital filter 2 operating at 3.456 GHz, parallel processing as described above is effective. However, parallel processing increases the circuit scale.

In view of the above, in this specific example, in order to achieve parallel processing while suppressing increase in circuit scale, a zero-inserted double upsampled signal is used as the input signal. In this way, increase in circuit scale is suppressed as shown in FIG. 5.

Figure 5:
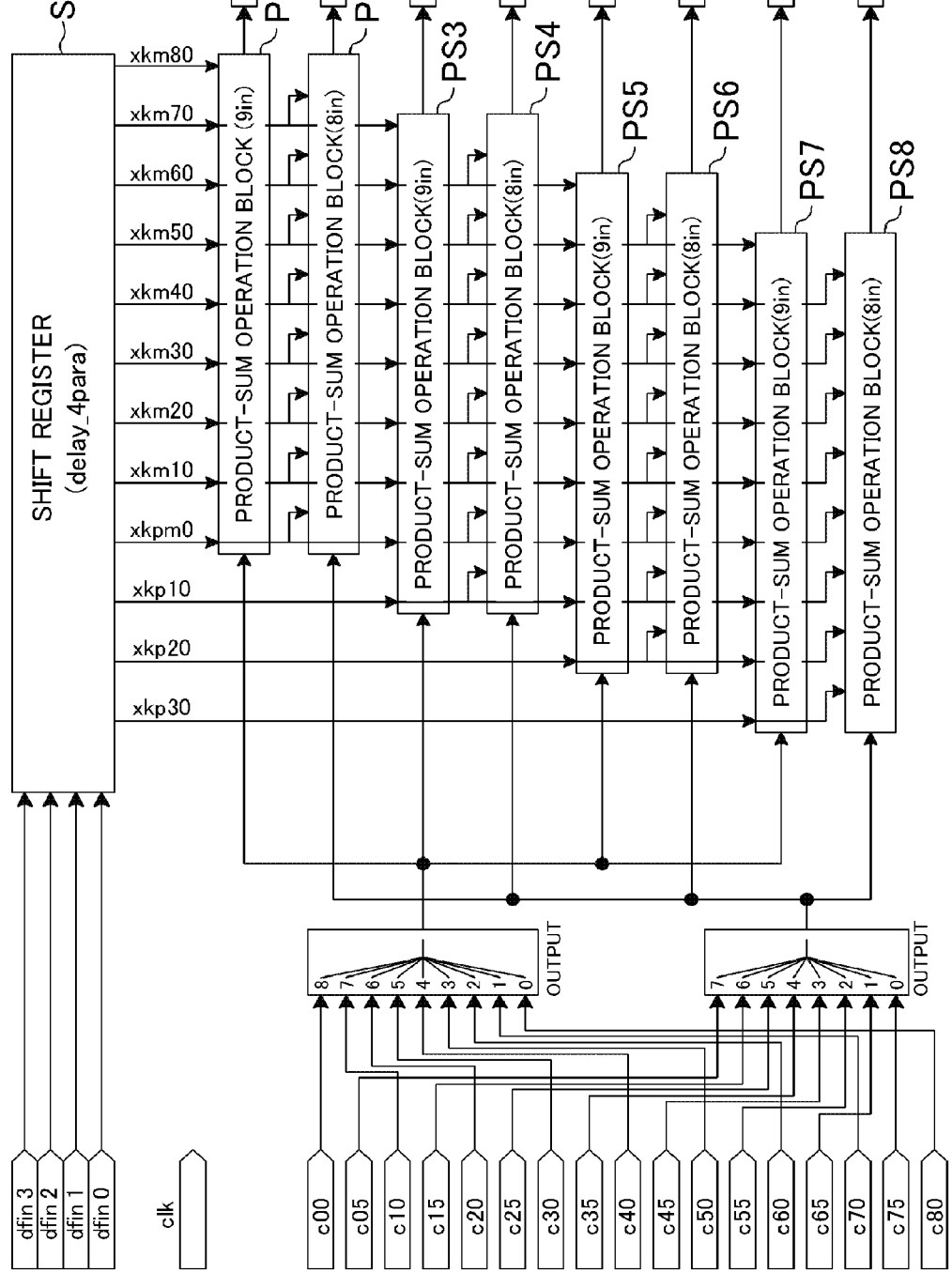
FIG. 5 is a view showing a specific example of a digital filter.

The digital filter 2 shown in FIG. 5 has an eight-parallel configuration, where the frequency of a clock signal clk is 432 MHz that is one-eighth of 3.456 GHz.

In FIG. 5, dfin0 to 3 denote digital filter input signals. Eight inputs should theoretically be necessary for the eight-parallel configuration. However, since the zero-inserted double upsampling is adopted, only four inputs are used excluding the inserted zero values.

In FIG. 5, also, SR denotes a shift register for parallel input signals, which outputs signals xkp30, xkp20, xkp10, . . . , xkm80 in order of increasing delay amount.

The reference characters c00, c05, c10, . . . , c80 denote digital filter coefficients. By setting these coefficients appropriately, the properties of the RRC filter can be obtained.

The reference characters PS1 to PS8 denote blocks that perform product-sum operation. Each of the blocks multiplies outputs of the shift register SR by coefficients c00, . . . , sums all of the multiplication results, and outputs the summed result. The output values are ykpm0, ykp05, ykp10, . . . , ykp35 in order from older to newer. Being eight-parallel processing, the eight values are output simultaneously. These values are input into the DAC 3.

A feature of the above configuration is that either a set of even-number coefficients (c00, c10, c20, . . . , c80) or a set of odd-number coefficients (c05, c15, c25, . . . , c75) are supplied to the product-sum operation blocks PS1 to PS8. By calculating the output value using only a half of all the coefficients, the circuit scale of the product-sum operation blocks can be halved.

(Configuration of PLL Circuit)

Figure 6:
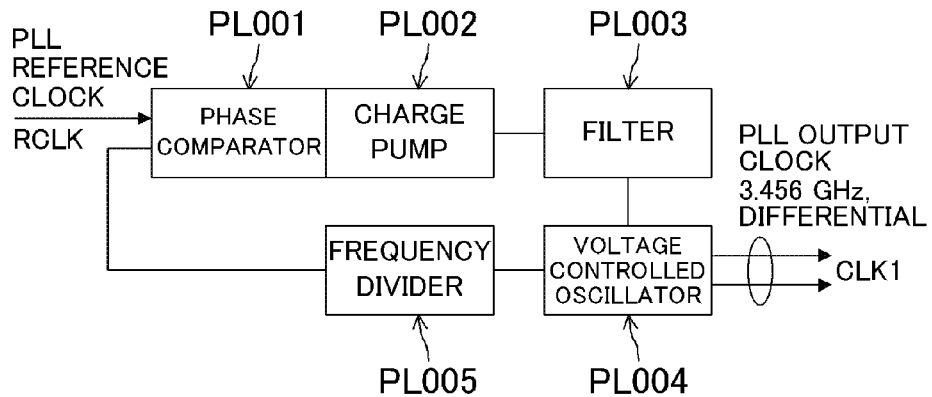
FIG. 6 is a view showing a specific example of a PLL circuit.

FIG. 6 shows an example internal configuration of the PLL circuit 4.

The PLL circuit 4 generates a differential clock of several GHz, e.g., 3.456 GHz, which is necessary for operation of the DAC 3.

In FIG. 6, the PLL circuit 4 includes a phase comparator PL001, a charge pump PL002, a filter PL003, a voltage-controlled oscillator PL004, and a frequency divider PL005, and generates a differential clock CLK1 having a required frequency from an input PLL reference clock RCLK.

The phase comparator PL001 compares the phase of the PLL reference clock RCLK with the phase of an output signal of the frequency divider PL005, and outputs an up signal or a down signal to the charge pump PL002 according to the comparison result. The charge pump PL002 charges the filter PL003 to increase the voltage of the filter PL003 when receiving the up signal from the phase comparator PL001, or discharges the filter PL003 to decrease the voltage of the filter PL003 when receiving the down signal from the phase comparator PL001. In the voltage-controlled oscillator PL004, which has a differential ring oscillator (not shown), a current corresponding to the voltage of the filter PL003 is allowed to flow through the differential ring oscillator, thereby to output the differential clock CLK1 having a desired frequency. The frequency divider PL005 divides the frequency of the output signal of the voltage-controlled oscillator PL004 and outputs the result to the phase comparator PL001.

The duty ratio of the clock used in the DAC 3 must be close to 50%. Also, the clock CLK1 output from the PLL circuit 5 is sent to the DAC 3 via a differential buffer (not shown) while remaining as the differential clock because of its high frequency of 3.456 GHz.

(Fourth Embodiment)

Figure 7:
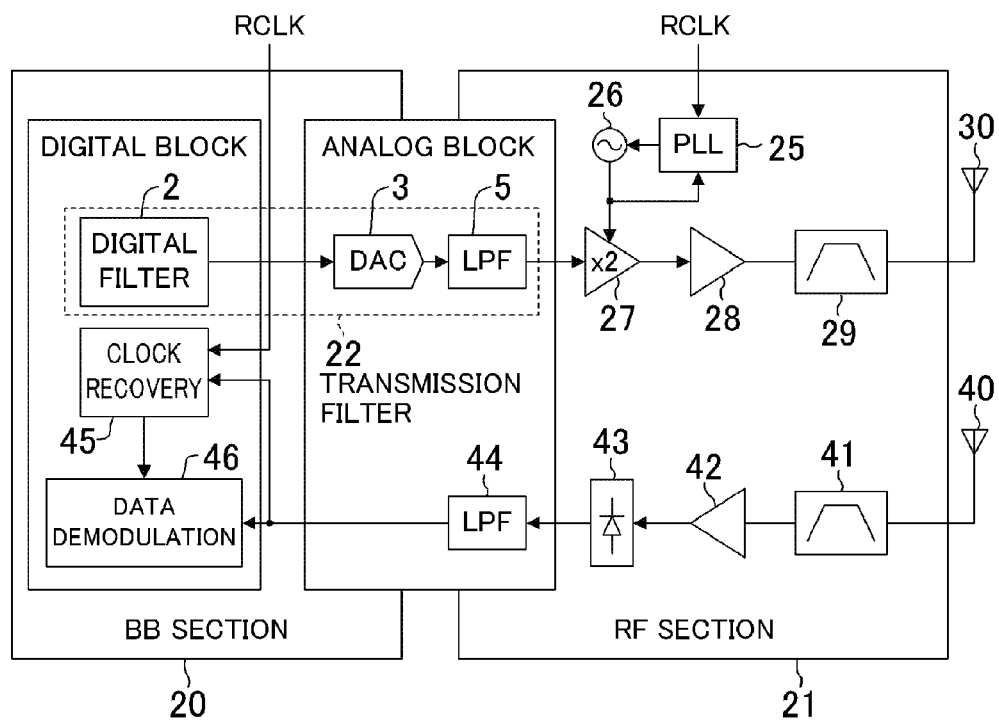
FIG. 7 is a view showing an overall schematic configuration of a milliwave communication system of the fourth embodiment of the present disclosure.

FIG. 7 shows an entire configuration of a milliwave communication system of the fourth embodiment of the present disclosure, which is provided with the transmission filter circuit of the first embodiment.

The milliwave communication system of FIG. 7 includes a baseband (BB) section 20 and a RF section 21. In its data transmission system, transmission data is allowed to pass through a transmission filter circuit 22 that corresponds to the transmission filter circuit of the first embodiment shown in FIG. 1 provided with the RRC filters (illustration of the PLL circuit 4 is omitted in FIG. 7), and then sent to the RF section 21. In the RF section 21, a mixer 27 modulates the transmission signal having passed through the transmission filter circuit 22 with a carrier of about 60 GHz generated by a PLL circuit 25 and a VCO 26. The modulated signal is amplified by an amplifier (AMP) 28 and passes through a band pass filter (BPF) 29, to be transmitted from an antenna 30 as the transmission signal.

In its data reception system, a reception signal received from an antenna 40 passes through a BPF 41 and an AMP 42 in the RF section 21, and a D detector 43 detects an envelope of the signal waveform. The resultant reception signal then passes through an LPF 44 before being sent to the BB section 20, where the reception signal is demodulated by a demodulator 46 while being synchronized by a clock recovery circuit 45.

Although the transmission filter circuit 22 in this embodiment has the configuration described in the first embodiment, it is not limited to this, but naturally may have the configuration described in the second or third embodiment.

As described above, according to the present disclosure, a transmission filter circuit operating at a high speed of several GHz can be presented, which is useful as a circuit implementing a high-speed RRC filter required for milliwave communication, etc.

What is claimed is:

1. A filter circuit comprising:
a plurality of digital circuits; and
a digital-to-analog converter (DAC) configured to receive a reference clock having a reference frequency and to operate with the reference clock, wherein:
the DAC includes a plurality of decoders configured to perform parallel processing with the plurality of digital circuits, respectively, and
the plurality of decoders and the plurality of digital circuits are configured to receive a frequency-divided clock having a divided-frequency of the reference frequency and to operate with the frequency-divided clock.

2. The filter circuit of claim 1, wherein the filter circuit is a transmission filter disposed upstream of a radio frequency (RF) section that outputs a signal from an antenna.

3. A semiconductor integrated circuit comprising the filter circuit of claim 1.

4. A communication apparatus comprising the filter circuit of claim 1.

5. The filter circuit of claim 1, wherein:
the filter circuit is configured to receive a signal comprising data corresponding to a plurality of channels,
the filter circuit comprises a plurality of DACs,
a number of the plurality of digital filters and a number of the plurality of DACs are equal in number to the plurality of channels, and
the plurality of DACs share a clock buffer inserted in a reference clock line connected to a clock supplying circuit, the clock being supplied through the reference clock line.

6. The filter circuit of claim 5, wherein the signal comprising data corresponding to the plurality of channels is an orthogonal signal including an I signal and a Q signal.

7. The filter circuit of claim 1, wherein the plurality of digital circuits and the plurality of decoders in the DAC are configured to process orthogonal signals in parallel which include an I signal and a Q signal.

8. The filter circuit of claim 1, further comprising:
a parallel-to-serial converter configured to convert a plurality of output signals from the plurality of decoders to a serial signal.

9. The filter circuit of claim 8, further comprising:
a switch driver configured to receive the serial signal from the parallel-to-serial converter and drive a switch,
wherein the reference clock is supplied to the switch driver.

10. The filter circuit of claim 9, further comprising:
a frequency divider configured to divide the frequency of the reference clock and generate the frequency-divided clock.

11. The filter circuit of claim 8, wherein the frequency-divided clock is supplied to the parallel-to-serial converter.

12. A semiconductor device comprising a plurality of filter circuits of claim 9, wherein the reference clock is supplied through a clock buffer to each switch driver of the plurality of filter circuits.

13. The filter circuit of claim 10, wherein the parallel-to-serial converter, the switch driver and the frequency divider are disposed in the DAC.

14. The filter circuit of claim 1, further comprising a clock supplying circuit configured to supply the reference clock to the DAC.

15. The filter circuit of claim 14, wherein the clock supplying circuit is a PLL circuit.

16. The filter circuit of claim 1, further comprising:
a frequency divider configured to divide the frequency of the reference clock and generate the frequency-divided clock.

17. The filter circuit of claim 16, wherein the frequency dividing circuit is included in the DAC.

18. A system comprising;
a baseband circuit;
an RF circuit; and
the filter circuit according to claim 1,
wherein a transmission data is sent from the baseband circuit through the filter circuit to the RF circuit.

* * * * *